US011996146B2

(12) United States Patent
Kim

(10) Patent No.: US 11,996,146 B2
(45) Date of Patent: *May 28, 2024

(54) METHOD FOR READING CROSS POINT-TYPE MEMORY ARRAY INCLUDING TWO-TERMINAL SWITCHING MATERIAL

(71) Applicant: Jun-sung Kim, Baltimore, MD (US)

(72) Inventor: Jun-sung Kim, Baltimore, MD (US)

(*) Notice: Subject to any disclaimer, the term of this patent is extended or adjusted under 35 U.S.C. 154(b) by 352 days.

This patent is subject to a terminal disclaimer.

(21) Appl. No.: 17/599,528

(22) PCT Filed: Apr. 2, 2020

(86) PCT No.: PCT/KR2020/004517
§ 371 (c)(1),
(2) Date: Sep. 28, 2021

(87) PCT Pub. No.: WO2020/204628
PCT Pub. Date: Oct. 8, 2020

(65) Prior Publication Data
US 2022/0148654 A1    May 12, 2022

Related U.S. Application Data

(63) Continuation of application No. 16/372,935, filed on Apr. 2, 2019, now Pat. No. 10,896,726.

(51) Int. Cl.
*G11C 11/00* (2006.01)
*G06N 3/063* (2023.01)
*G11C 13/00* (2006.01)

(52) U.S. Cl.
CPC .......... *G11C 13/004* (2013.01); *G06N 3/063* (2013.01); *G11C 13/003* (2013.01);
(Continued)

(58) Field of Classification Search
CPC . G11C 13/004; G11C 13/003; G11C 2213/15; G11C 2213/32; G11C 2213/71;
(Continued)

(56) References Cited

U.S. PATENT DOCUMENTS 10,134,469 B1    11/2018  Liu et al.
10,896,726 B2 *   1/2021  Kim ..................... G11C 13/003
(Continued)

FOREIGN PATENT DOCUMENTS

JP          2005-116162      4/2005
KR      10-2008-0112976     12/2008
(Continued)

OTHER PUBLICATIONS

Greg S. Snider, "Spike-timing-dependent learning in memristive nanodevices" 2008 IEEE/ACM international symposium on nanoscale architectures (NANOARCH 2008), Jun. 12, 2008, pp. 85-92.
(Continued)

*Primary Examiner* — Hien N Nguyen
(74) *Attorney, Agent, or Firm* — LEX IP MEISTER, PLLC

(57) ABSTRACT

The present invention provides a method for reading a current for processing analog information in a memory array for a synaptic device. To this end, the present invention provides a method for reading a memory array including a two-terminal switching material, including (a) selecting at least one cell by applying a voltage to the memory array and (b) simultaneously measuring the sum of currents from the at least one cell selected. The voltage applied to the at least one cell selected in operation (a) is higher than a voltage applied to at least one cell not selected while being within a range in which all of the selected at least one cell is not turned on.

7 Claims, 5 Drawing Sheets

(52) U.S. Cl.
CPC ...... *G11C 2213/15* (2013.01); *G11C 2213/32* (2013.01); *G11C 2213/71* (2013.01)

(58) Field of Classification Search
CPC . G11C 11/1673; G11C 2213/76; G11C 11/54; G11C 13/0033; G06N 3/063; G06N 3/065
See application file for complete search history.

(56) References Cited

U.S. PATENT DOCUMENTS

| | | |
|---|---|---|
| 2010/0080037 A1 | 4/2010 | Inoue et al. |
| 2011/0002156 A1 | 1/2011 | Murooka |
| 2011/0188289 A1 | 8/2011 | Chevallier et al. |
| 2011/0305066 A1 | 12/2011 | Nazarian et al. |
| 2014/0112058 A1 | 4/2014 | Kellam et al. |
| 2014/0293674 A1 | 10/2014 | Johnson |
| 2015/0074326 A1 | 3/2015 | Castro |
| 2017/0092359 A1 | 3/2017 | Louie et al. |
| 2019/0172998 A1 | 6/2019 | Tan et al. |

FOREIGN PATENT DOCUMENTS

| | | |
|---|---|---|
| KR | 10-2016-0074238 | 6/2016 |
| KR | 10-1875835 | 8/2018 |
| KR | 10-2018-0129298 | 12/2018 |
| WO | 2009075130 | 6/2009 |
| WO | 2017048293 | 3/2017 |

OTHER PUBLICATIONS

EPO, European Search Report of Application No. 20783910.1, dated Feb. 17, 2023.

\* cited by examiner

[Fig. 1]
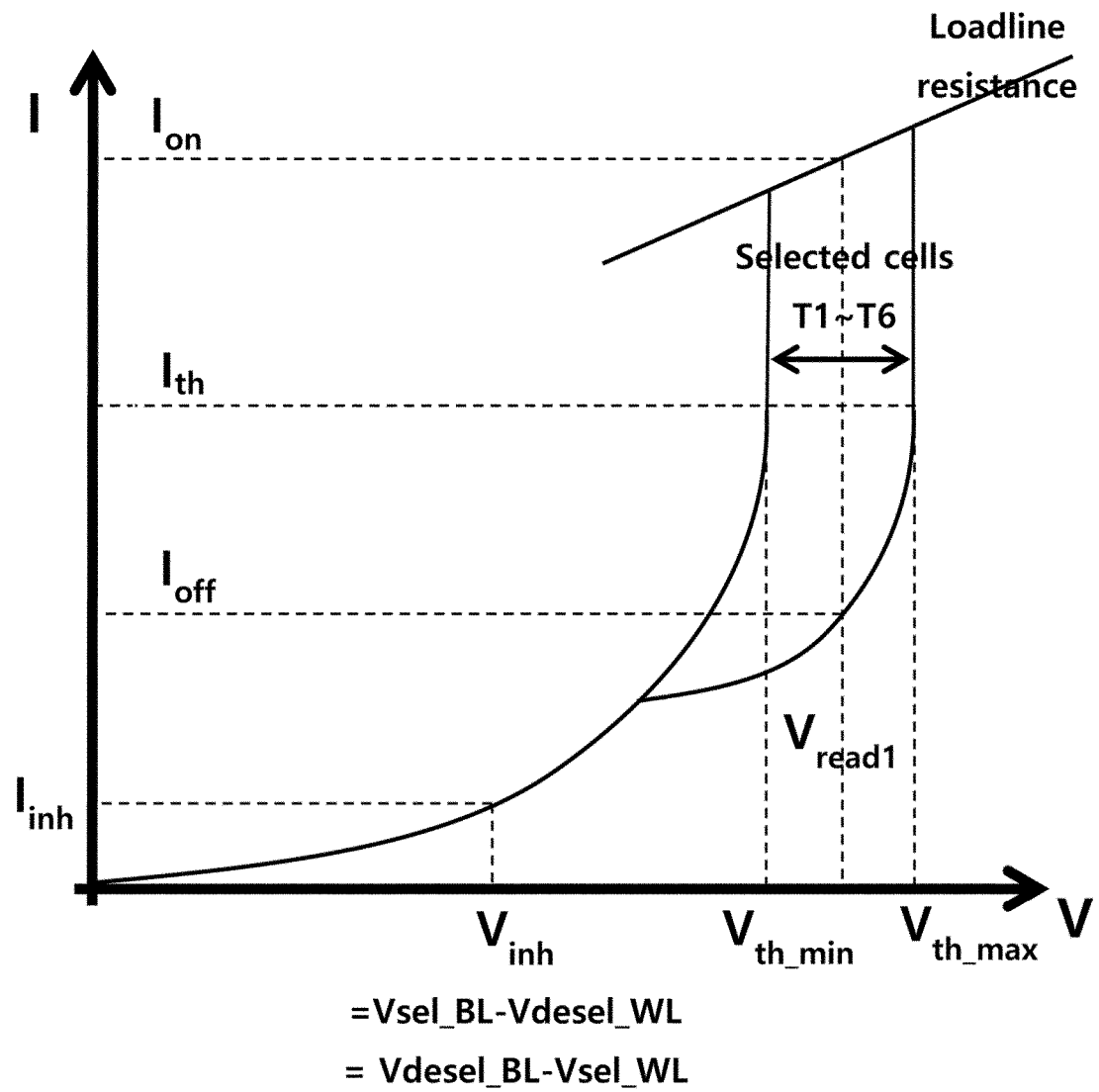

[Fig. 2]
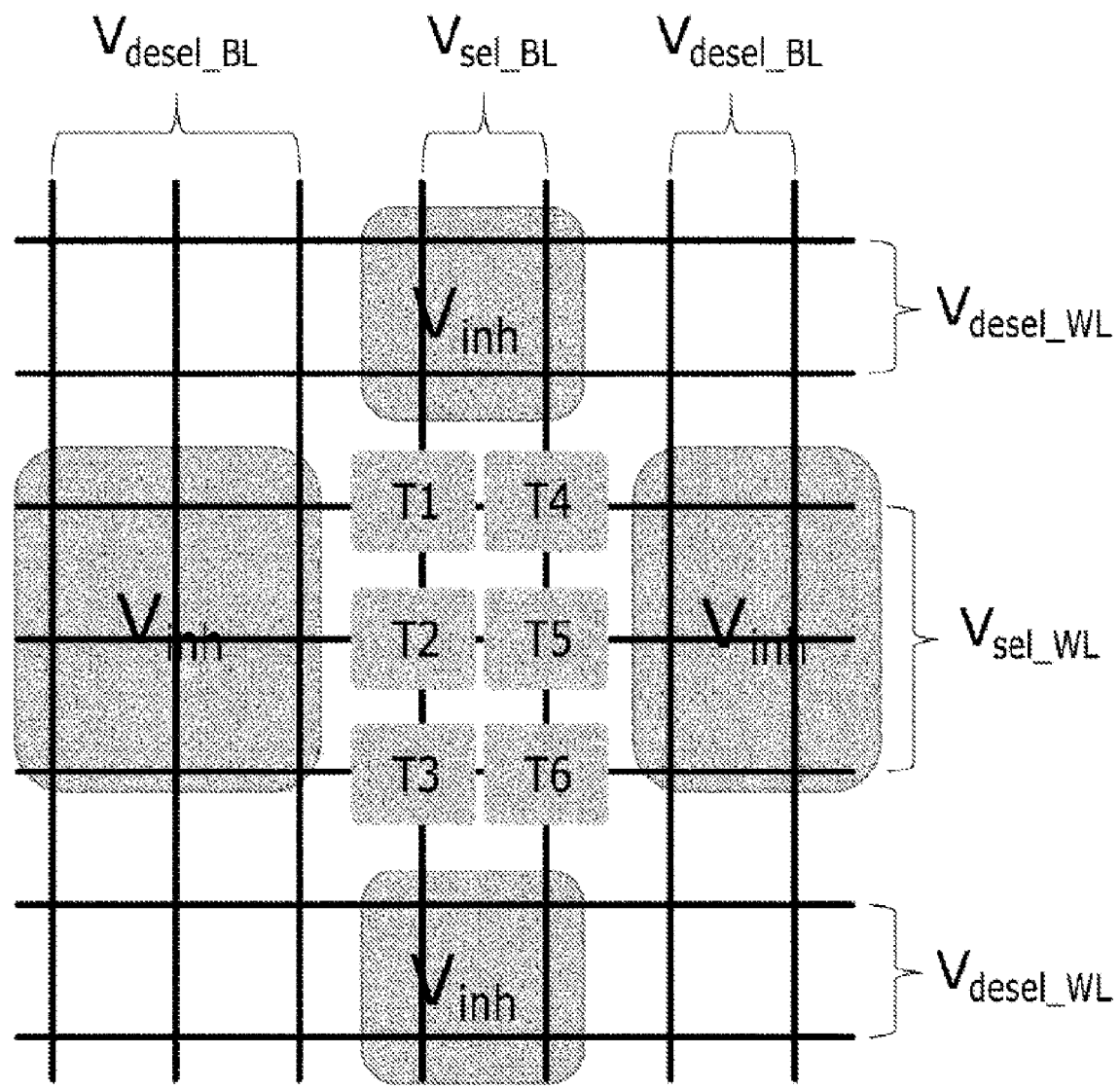

[Fig. 3]
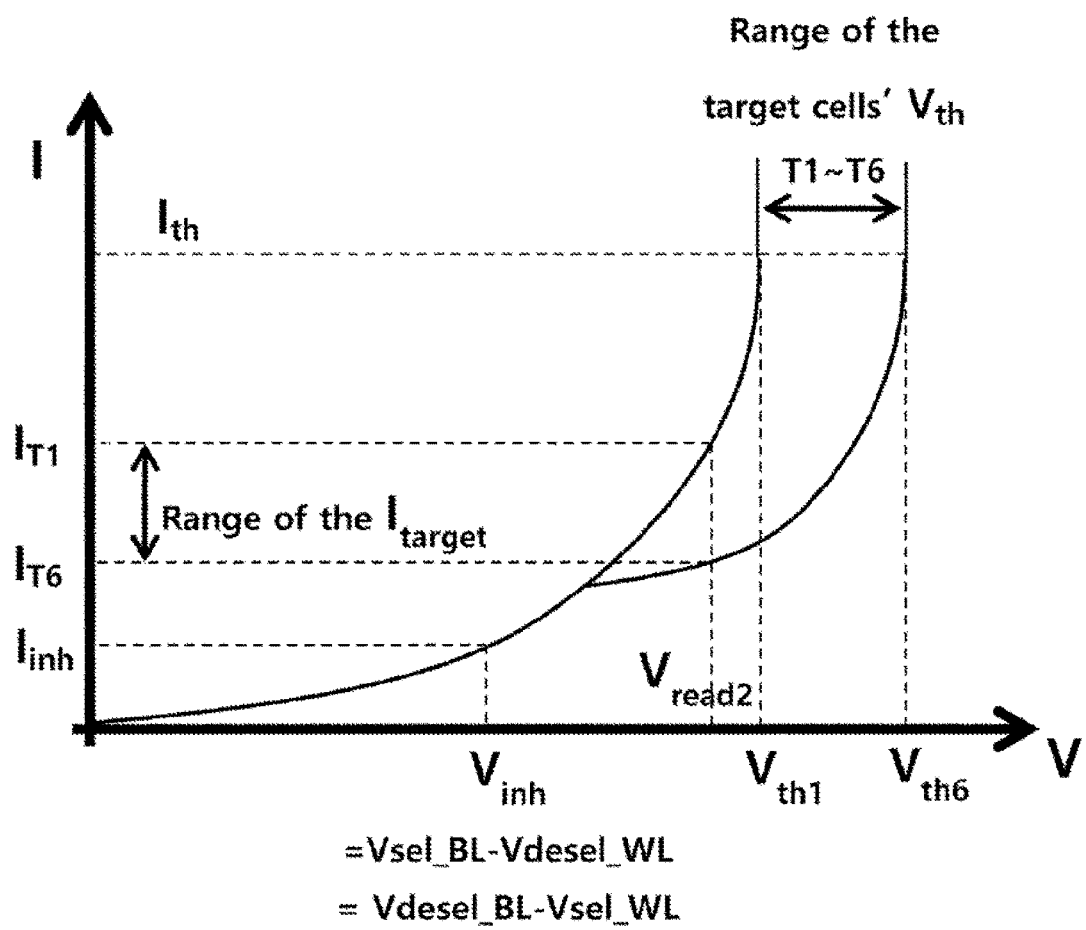

[Fig. 4]
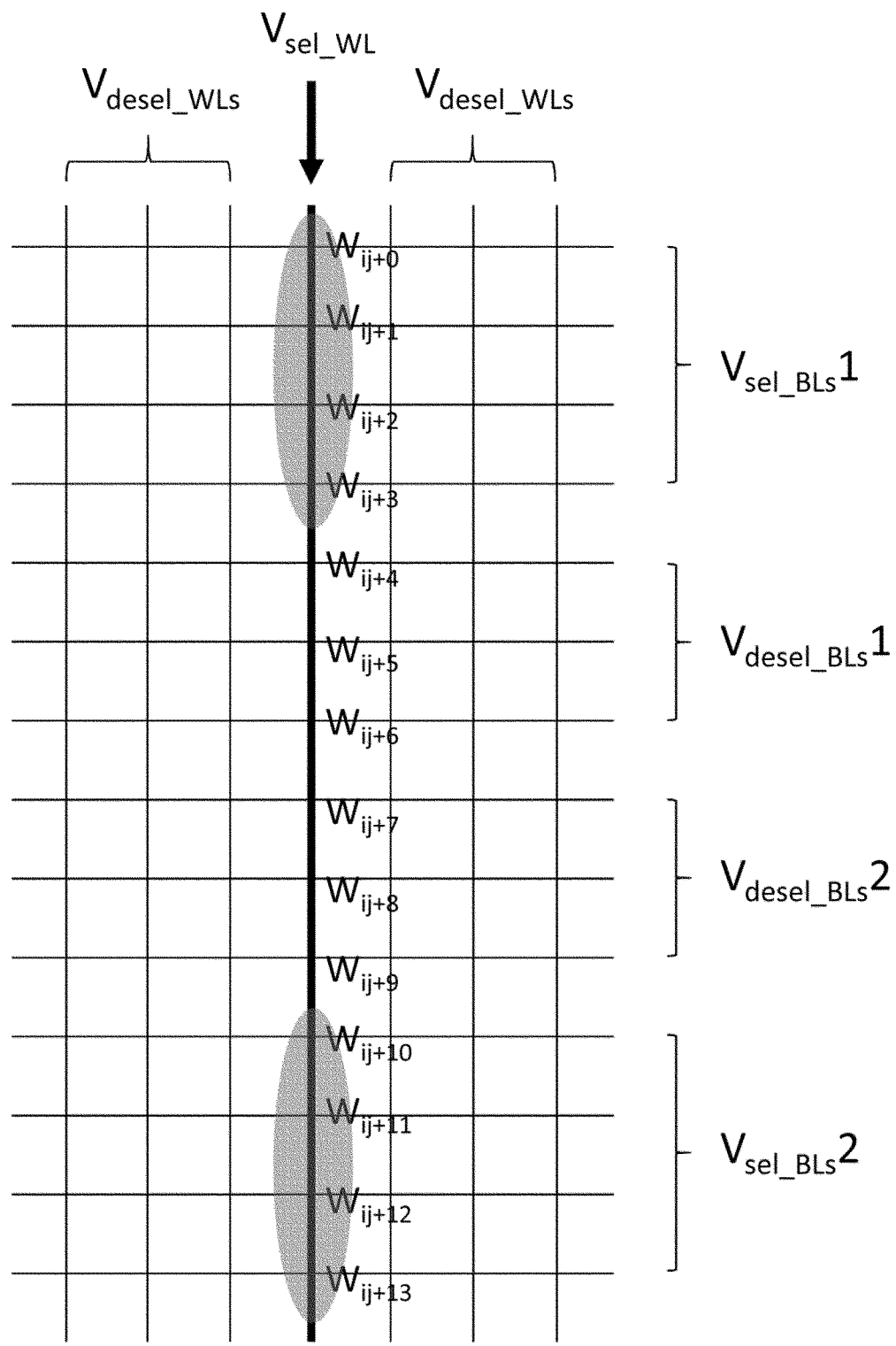

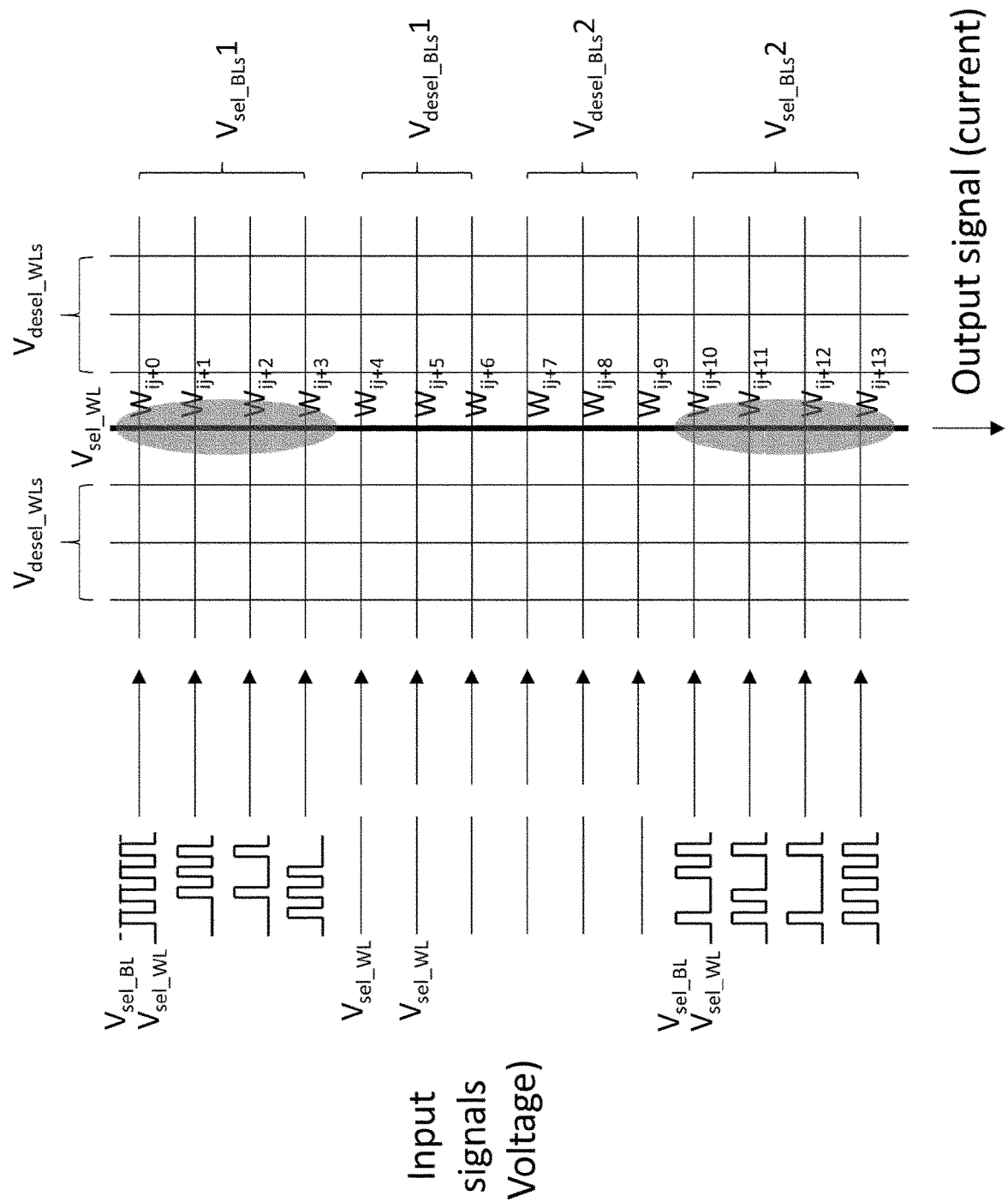
[FIG.5]

METHOD FOR READING CROSS POINT-TYPE MEMORY ARRAY INCLUDING TWO-TERMINAL SWITCHING MATERIAL

TECHNICAL FIELD

The present invention relates to a method for reading a memory array comprising a two-terminal switching material, more particularly, the present invention relates to a method for reading a memory array for a synaptic device which may simultaneously read currents flowing in the memory array within a low current range, thereby reading currents distinguished according to cells selected from the memory array and the sum of the currents through low power consumption.

BACKGROUND ART

The artificial intelligence semiconductor industry is now in an embryonic stage. In recent years, semiconductor design and manufacturing companies have started to release prototypes or early products. These prototypes or early products are first-generation artificial intelligence semiconductor products based on complementary metal-oxide semiconductor (CMOS) technology and is no different from conventional semiconductor products in terms of material. New materials are expected to be introduced and used in second-generation artificial intelligence semiconductor products in earnest.

Artificial synapses having all of the key characteristics of biological synapses must be implemented as a single device to fabricate second-generation artificial intelligence semiconductors having a degree of integration similar to that of biological neural networks. In particular, the device size needs to be small in order to increase the degree of integration, and the characteristics of gradual changes in current (resistance) are very important such that one synapse has various weights. To achieve such a purpose, various types of artificial synapse devices have been proposed and fabricated. Most of these devices are based on memory devices such as a flash memory, a resistive random access memory (RRAM), a phase change random access memory (PRAM), and a magnetic random access memory (MRAM).

The technology that has been studied in the semiconductor field for synaptic devices to date is to distinguish a low resistance state and a high resistance state from memory arrays using memristors such as RRAM, PRAM, and MRAM and store information in each cell. Research has been conducted in the direction of implementing high changes in resistance in digital methods of an on or off type and reading the logic states of cells in memory arrays in accordance with such changes in resistance. However, since synaptic systems have characteristics that occur in continuously varying analog methods other than digital methods, information cannot be sufficiently processed by measuring changes in logic state of cells in the digital methods. Thus, synaptic devices for neuromorphic applications or the like are required to be able to read the currents from multiple cells at the same time and to sense variations in current through the sum of the currents from the respective cells.

Further, since the device size must be small and it is very important to reduce the process cost in order to fabricate memory cells for such synaptic devices, the memory cells are required to be manufactured based on cross-point structures. Cross-point structures can be manufactured in three dimensions in which memory cells are vertically stacked without using transistors compared to 1T1R structures that are generally known and consist of a transistor and a memory cell, thereby increasing the density of the memory cells and reducing the number of manufacturing processes.

Such cross-point structures are required to include two-terminal switching materials that allow memory cells to have the flow of a very small amount of current in a low voltage area and exhibit a rapid rise in current at a specific voltage or higher. The process of selecting, reading, and programming cells is performed through word lines and bit lines that cross each other in memory arrays having a cross-point structure. In particular, sneak currents and voltage drops that occur in reading and programming the cells make it difficult to increase the size of the memory arrays. Switching materials are used to solve such an issue.

Thus, the present invention relates to a method for reading a memory array for a synaptic device that has such a cross-point structure and includes a two-terminal switching material.

DISCLOSURE OF THE INVENTION

Technical Problem

The present invention provides a method for reading a current for processing analog information in a memory array for a synaptic device.

Technical Solution

According to an embodiment of the invention, there is provided a method for reading a memory array including a two-terminal switching material, the method including: (a) selecting at least one cell by applying a voltage to the memory array; and (b) simultaneously measuring the sum of currents from the at least one cell selected, wherein the voltage applied to the at least one cell selected in operation (a) is higher than a voltage applied to at least one cell not selected while being within a range in which all of the selected at least one cell is not turned on.

Advantageous Effects

According to the method according to the present invention, since it is possible to simultaneously read several cells from the memory arrays having the cross-point type structure and sense the amount of change in total current through the sum of currents from the respective cells, it is possible to increase the utilization of memory semiconductors as synaptic devices or fully connected layers and convolutional neural networks (CNNs) for neuromorphic applications.

BRIEF DESCRIPTION OF THE DRAWINGS

FIG. 1 is a graph illustrating a conventional method for reading a memory array having a cross-point structure.

FIG. 2 is a diagram illustrating a method for selecting cells from a memory array having a cross-point structure according to an embodiment of the invention.

FIG. 3 is a graph illustrating a method for reading the memory array having the cross-point structure according to an embodiment of the invention.

FIG. 4 is a diagram illustrating a reading method according to a position of a cell selected in a memory array having a cross-point structure according to an embodiment of the invention.

FIG. 5 is a diagram illustrating application of a pulse voltage to a memory array having the cross-point structure according an embodiment of the invention.

MODE FOR CARRYING OUT THE INVENTION

Hereinafter, the configuration and function of embodiments of the invention will be described with reference to the accompanying drawings. In the following description of the invention, a detailed description of known functions and configurations incorporated herein will be omitted when it may make the subject matter of the invention rather unclear. In addition, when a part "includes" an element, another element may be further included, rather than excluding another element, unless otherwise stated.

A method for reading a memory array including a two-terminal switching material according to an embodiment of the invention includes: (a) selecting at least one cell by applying a voltage to a memory array; and (b) simultaneously measuring the sum of currents from the at least one cell selected. The voltage applied to the at least one cell selected in operation (a) is higher than a voltage applied to at least one cell not selected while being within a range of a voltage at which all of the at least one cell selected is not turned on.

The memory array includes the two-terminal switching material and has a cross-point structure in which word lines and bit lines, which are address lines, are arranged in a grid, and such memory cells connect the word lines to the bit lines at points at which the word lines cross the bit lines. The memory cells may be manufactured based on, for example, memory devices such as a resistive random access memory (RRAM), a phase change random access memory (PRAM), and a magnetic random access memory (MRAM) while including the two-terminal switching material.

The two-terminal switching material has a property that causes a significant change in resistance when a voltage above a certain level is applied thereto. A voltage at which a change in resistance occurs in the memory cells including the two-terminal switching material is represented as a threshold voltage, and a phenomenon that the change in resistance occurs is represented as being turned on.

A general reading process in the memory array having the cross-point structure is performed by allowing only a very low current to flow in cells not selected at lower than or equal to a threshold voltage and allow a voltage capable of distinguishing logic states of cells selected to be applied to the cells selected by using the property of the two-terminal switching material.

A conventional method for reading a memory array including a two-terminal switching material and having a cross-point structure is described with reference to FIG. 1. A voltage $V_{inh}$ is applied to the cells not selected, and in a region in which the voltage $V_{inh}$ is applied, cells having high and low resistances are not distinguished, and the flows of currents become very less. In contrast, a voltage $V_{read1}$ is applied to the cells selected, and the logic states may be distinguished from the currents flowing in the cells selected by applying the voltage $V_{read1}$ ($V_{th\_A} < V_{read1} < V_{th\_B}$) at a level between a threshold voltage $V_{th\_A}$ having a low resistance and a threshold voltage $V_{th\_B}$ having a high resistance. FIG. 1 illustrates that the voltage $V_{read1}$ allows a current $I_{target,\ off}$ to flow in the cells having a high resistance and a current $I_{target,\ on}$ to flow in the cells having a low resistance. The conventional method may select only one cell from the memory array and read only digital on and off states, thereby being difficult to apply to a synaptic device, and may causes a power consumption issue since the flows of currents in an on state are very large.

The invention provides a method for selecting at least one cell and reading the sum of currents flowing in the memory array through the at least one cell selected. Such a process is described with reference to FIG. 2. Cells positioned at points at which bit lines and word lines having high voltages $V_{sel\_BL}$ and $V_{sel\_WL}$ applied thereto cross each other are selected by a high voltage difference and read, and cells to which any one of bit lines or word lines having low voltages $V_{desel\_BL}$ and $V_{desel\_WL}$ applied thereto is connected are not selected. For example, when a voltage of 3 V $V_{sel\_BL}$ is applied to two bit lines, a voltage of −3 V $V_{sel\_WL}$ is applied to two word lines, a voltage of 0 V $V_{desel\_BL}$ and $V_{desel\_WL}$ is applied to the remaining bit lines and word lines, a voltage of 6 V is applied to cells T1 to T6, and a voltage of lower than or equal to 3 V is applied to the remaining cells. In this case, since a very small current flows in the cells having a voltage of lower than or equal to 3 V applied thereto, the cells are not read and selected in the reading process, and since a current having a significant level flows in the cells T1 to T6 having a voltage of 6 V applied thereto, the cells T1 to T6 are read and selected in the reading process. The two-terminal switching material enables the selections.

FIG. 3 illustrates a process of reading currents from cells being selected in such a manner. As in the conventional method, the voltage $V_{inh}$ is applied to the cells not selected. In the region in which the voltage $V_{inh}$ is applied, the flows of currents occur according to resistance states of the cells. Thus, the cells are not distinguished, and the flows of currents become very less.

However, unlike the conventional method for applying, to the cells selected, a voltage at a level between the threshold voltage $V_{th\_A}$ having a low resistance and the threshold voltage $V_{th\_B}$ having a high resistance, the method according to the embodiment of the invention allows a voltage to be applied to the at least one cell selected such that the voltage is within a range of a subthreshold region voltage at which all of the at least one cell selected is not turned on and within a range of a voltage higher than that applied to the at least one cell not selected as indicated as a voltage "$V_{read2}$" in FIG. 3. For example, FIG. 3 illustrates that the voltage $V_{read2}$ is within a range between a voltage higher than a voltage Vinh and a voltage lower than a voltage $V_{th1}$, which is a threshold voltage of a cell of the cells selected that has a lowest resistance.

In addition, the minimum current flowed by the voltage applied to the at least one cell selected may be within a range of a voltage higher than the sum of currents flowed by the voltage applied to the at least one cell not selected.

As illustrated in FIG. 3, when the cells selected by applying "$V_{read2}$" thereto in FIG. 2, for example, have different resistances, and the magnitude of the resistances is T6>T5>T4>T3>T2>T1, a current $I_{T6}$ flows in the cell T6, which has a highest resistance and the flows of currents thus become small. The reason is because the cells may be easily selected when the current $I_{T6}$ is higher than the sum of currents $I_{inh}$ flowing through the cells not selected. Thus, when the current $I_{inh}$ flows in n cells, the current $I_{T6}$ may be higher than $n \times I_{inh}$.

In addition, the minimum current flowed by the voltage applied to the at least one cell selected may be n (here, n is the number of cells in the same column and row) times higher than or equal to currents of unit cells flowed by a bias voltage applied to the at least one cell not selected.

More specifically, referring to FIG. 3, when $I_{T6}$, which is the lowest current of the currents flowed in the respective cells by the voltage $V_{read2}$ (being within a range between a voltage higher than the voltage $V_{inh}$ and a voltage lower than the voltage $V_{th1}$) applied to the cells selected, becomes n (here, n is an integer number) times higher than or equal to the current $I_{inh}$ flowing in unit cells not selected, the cells may be selected more smoothly, and the size of the memory array may be increased. As described above, the minimum current flowing by the voltage applied to the at least one cell selected enables the size of the memory array to be adjusted as well as the ease of cell selection by controlling the difference in currents of unit cells flowing by the bias voltage applied to the at least one cell not selected.

In addition, in an embodiment of the invention, the voltage applied to the at least one cell selected may be applied thereto such as to be within a range of a voltage at which the currents flowed in the respective cells by the voltage may be distinguished from each other according to the resistance characteristics of the cells.

As described above, the currents flowing in the cells selected may be distinguished and measured, thereby increasing the utilization of the memory array as the synaptic device through analog operations. Referring to FIG. 3, the voltage $V_{read2}$, which is the voltage applied to the cells selected in the reading process, may be set to be within a range between a voltage higher than a voltage $V_{sep}$ at which an I-V curve is separated according to the resistance characteristics of the cells selected and a voltage lower than the voltage $V_{th1}$, which is the lowest threshold voltage. In this case, all of the currents flowed in the cells T1 to T6 having different resistances by the voltage $V_{read2}$ applied have different values.

In addition, in an embodiment of the invention, a difference between a maximum current and a minimum current of the currents flowing in the at least one cell selected may be beyond a range of a voltage at which the currents flowing in the respective cells are measurable.

For example, the highest value of values of currents flowing in the cells selected may be set to be 1.2 times greater than or equal to the lowest value in order to distinguish and measure the currents flowing according to the resistance characteristics of the cells selected, as described above. Referring to FIG. 3, the reading process may be performed more smoothly when the voltage $V_{read2}$ applied to the cells selected is set to be within a range of a voltage higher than the voltage $V_{sep}$ at which the I-V curve is separated and a voltage lower than the voltage $V_{th1}$, which is the lowest threshold voltage, while a current $I_{T6}$, which is the highest current of the currents flowed in the respective cells selected by the $V_{read2}$, is set to be 1.2 greater than or equal to a current $I_{T1}$, which is the lowest current.

In addition, in an embodiment of the invention, the two-terminal switching material may be at least one among an ovonic threshold switching material, a transition metal oxide switching material, a mixed ion-electron conductor (MIEC) switching material, a complementary resistor switching material, and doped amorphous silicon. In addition to the above materials, a material is also not particularly limited as long as the material may perform a two-terminal switching function defined in an embodiment of the invention.

The two-terminal switching material transitions an insulator state into a conductor state by having a resistance rapidly reduced when a voltage higher than or equal to a threshold voltage is applied thereto. In the invention, multiple cells may be selected from the memory array having a cross-point structure by using the characteristic. From this point of view, the abovementioned two-terminal switching material may be applied to the reading method proposed in the invention.

The method, according to an embodiment of the invention, may simultaneously read multiple cells from a cross-point type memory array and sense variations in total current through the sum of currents from the respective cells, thereby increasing the utilization of a memory semiconductor in a synaptic device for a neuromorphic application or in a fully connected layer.

As the abovementioned ovonic threshold switching material, a chalcogenide material is often used, and an In—Ge—As—Se alloy, a Te—Se alloy, an As—Se alloy, a Ge—Te alloy, a Ge—Se alloy, an As—Se—Te alloy, a Ge—As—Se alloy, a Ge—As—Sb alloy, a Ge—Sb—Te alloy, a Ge—Sb—Se alloy, a Ge—As—Te alloy, an Si—Ge—As—Se alloy, an Si—Te—As—Ge alloy, an In—Sb—Te alloy, an In—Sb—Se alloy, an In—Ge—As alloy, an In—Ge—Te alloy, an In—Te alloy, etc. may be used.

In addition, NbOx may be used as the transition metal oxide switching material, a compound containing Cu such as CuGeS or a MIEC conductor containing La, Sr, Ce, Ti, Li, Gd, etc. may be used as the MIEC switching material, and $SiO_x$ doped with W, $SiO_x$ doped with As, and $SiO_x$ doped with B may be used as the doped amorphous silicon.

However, in addition to the materials exemplified above, a material is also not particularly limited as long as the material may perform a switching function by a change in resistance.

In particular, such a two-terminal switching material may be a material having a threshold current, that is, a current in a range of 20 nA to 5 μA at the point in time when a sudden decrease in resistance occurs. In the invention, the current in the subthreshold region is measured in the selected cell. Since the current in the subthreshold region is lower than the threshold current, it may be difficult to measure the current if a two-terminal switching material having too low threshold current is used. On the other hand, if the threshold current is too high, power consumption may be high, which is not preferable.

According to an embodiment of the invention, there is provided a method for reading a memory array comprising a two-terminal switching material, in which a voltage applied to the memory array through a metal line, i.e., a word line or a bit line, is controlled so that a voltage drop, which occurs according to a current flow distance from a power source to the selected cell, in an individual cell voltage of the current arriving at one or more cells selected in the memory array is compensated for, and the current flow distance is determined by the number of cells through which the current applied to the memory array passes until the current arrives at the selected cell from the power source, and the length of the word line and bit line.

When a cell is selected and a voltage is applied thereto, the current flowing by the applied voltage passes through the word line and the bit line, which are metal lines, until the current arrives at the selected cell, and thus the current may have a voltage drop due to the resistance and also have a voltage drop due to the leakage current to the cells connected to the metal line. When such a voltage drop occurs and the current arrives at the selected cell, a voltage lower than a target voltage is applied to the selected cell. Therefore, in order for the target voltage to be applied to the selected cell, compensation should be made in consideration of this.

For the compensation, in FIG. 4, a case where cells selected are $W_{ij+0}$ to $W_{ij+3}$ was compared with a case where cells selected in FIG. 4 are $W_{ij+10}$ to $W_{ij+13}$. When $W_{ij+0}$ to $W_{ij+3}$, which are cells that are close to the power source, are selected, a voltage $V_{sel\_WL}$, which is applied through the word line, is applied to the selected cells almost as it is. However, in $W_{ij+10}$ to $W_{ij+13}$, which are far from the power source, a large voltage drop inevitably occurs due to the current leaking through cells $W_{ij+0}$ to $W_{ij+9}$, which are not selected in the middle, and the resistance caused by the passing word line. Accordingly, the voltage to be applied varies depending on a position of the cell to be selected in the memory array. In order to utilize the selected cells as a single synaptic device, accurate information cannot be obtained if the applied voltage varies according to the position. Accordingly, it is necessary to adjust the voltage to be applied to compensate for this voltage drop.

The voltage applied to the selected cell is equal to the difference between the voltages applied to the word line and the bit line as described above. For example, in FIG. 4, when $V_{sel\_WL}$ is 3 V and $V_{sel\_BLs1}$ is −3 V, 6 V is applied to $W_{ij+0}$ to $W_{ij+3}$ which are selected cells. However, if the selected cells are $W_{ij+10}$ to $W_{ij+13}$, even if the voltage $V_{sel\_WL}$ applied through the word line is 3 V initially, it may become 2.5 V after actually arriving at the selected cell. Here, when −3 V is applied to $V_{sel\_BLs2}$ so as to be the same as $V_{sel\_BLs1}$, 5.5 V is applied to $W_{ij+10}$ to $W_{ij+13}$ which are the selected cells and thus there is a problem that a voltage lower than the target voltage is applied. In particular, if all of $W_{ij+0}$ to $W_{ij+3}$ and $W_{ij+10}$ to $W_{ij+13}$ are selected cells, the current leaked by $W_{ij+0}$ to $W_{ij+3}$ to which voltage is first applied is larger, and thus the voltage drop appears larger.

In order to solve such a voltage drop, when a voltage is applied by selecting a cell at a position where a large voltage drop occurs, this voltage drop can be compensated for by making the difference between the voltages applied to the word line and the bit line larger in consideration of the voltage drop according to the position of the selected cell. In FIG. 4, if the voltage applied to $W_{ij+10}$ to $W_{ij+13}$ becomes 2.5 V due to the voltage drop, in order to compensate for this, if −3.5 V is applied to $V_{sel\_BLs2}$ instead of applying the same −3 V as $V_{sel\_BLs1}$, the same 6 V voltage as that of $W_{ij+0}$ to $W_{ij+3}$ in which no voltage drop occurs is applied to $W_{ij+10}$~$W_{ij+13}$ which are selected cells.

This voltage drop compensation may be achieved by simultaneously controlling the voltages applied to the bit line and the word line, but may be achieved by changing only the voltage on the other side of the bit line or the word line without changing the voltage on one side of the bit line or the word line for voltage drop compensation. That is, the voltage drop compensation can be achieved by controlling only the voltage of the bit line without changing the voltage of the word line for voltage drop compensation. Conversely, the voltage drop compensation can be achieved by changing the voltage of the word line without changing the voltage of the bit line. By changing only the voltage on one side of the bit line or the word line in this way, the control method can be made simpler.

In the invention, the voltage applied to the memory array may be a pulse voltage that varies with time. To the actual synaptic device, a pulse voltage that changes according to input information that changes with time is applied, rather than a single voltage. Accordingly, the method for reading the memory array according to the invention can be utilized when the pulse voltage that changes with time is applied. FIG. 5 illustrates that a voltage of this pulse type is applied, in which the word line is constant but the bit line changes with time, resulting in a pulse voltage caused by the voltage difference between the bit lines. This pulse voltage becomes an input signal and a current flowing from the memory array becomes a final output signal, so that the memory array operates as a synaptic device.

The invention claimed is:

1. A method for reading a memory array including a two-terminal switching material, the method comprising:
 (a) selecting at least one cell by applying a voltage to a memory array; and
 (b) simultaneously measuring the sum of currents from the at least one cell selected,
 wherein the voltage applied to the at least one cell selected in operation (a) is higher than a voltage applied to at least one cell not selected while being within a range in which all of the selected at least one cell is not turned on.

2. The method of claim 1,
 wherein a minimum current flowed by the voltage applied to the at least one cell selected is within a range higher than the sum of currents flowed by the voltage applied to the at least one cell not selected.

3. The method of claim 1,
 wherein the two-terminal switching material is one of an ovonic threshold switching material, a transition metal oxide switching material, a MIEC switching material, a complementary resistor switching material, and doped amorphous silicon.

4. The method of claim 1,
 wherein the two-terminal switching material has a threshold current of 20 nA or more and 5 μA or less.

5. The method of claim 1,
 wherein a voltage applied to the memory array through a word line and/or a bit line is controlled so that a voltage drop, which occurs according to a current flow distance from a power source to the selected cell, in an individual cell voltage of the current arriving at one or more cells selected in the memory array is compensated for, and
 the current flow distance is determined by the number of cells through which the current applied to the memory array passes until the current arrives at the selected cell from the power source, and a length of a word line and bit line.

6. The method of claim 5,
 wherein the voltage drop compensation is achieved by controlling a voltage to be applied to one or both of the bit lines and the word lines connected to the selected cells.

7. The method of claim 1,
 wherein a voltage applied to the memory array through a bit line and/or a word line is a pulse voltage that changes with time.

\* \* \* \* \*